(12) United States Patent
Hori et al.

(10) Patent No.: US 8,866,365 B2
(45) Date of Patent: Oct. 21, 2014

(54) COMPOSITE SUBSTRATE WITH PARTIALLY PLANARIZED IRREGULAR SURFACE

(71) Applicant: NGK Insulators, Ltd., Aichi-prefecture (JP)

(72) Inventors: Yuji Hori, Owariasahi (JP); Ryosuke Hattori, Ichinomiya (JP); Tomoyoshi Tai, Inazawa (JP)

(73) Assignee: NGK Insulators, Ltd., Aichi (JP)

( * ) Notice: Subject to any disclaimer, the term of this patent is extended or adjusted under 35 U.S.C. 154(b) by 0 days.

(21) Appl. No.: 14/167,724

(22) Filed: Jan. 29, 2014

(65) Prior Publication Data

US 2014/0145558 A1    May 29, 2014

Related U.S. Application Data

(63) Continuation of application No. PCT/JP2013/069198, filed on Jul. 12, 2013.

(30) Foreign Application Priority Data

Aug. 17, 2012 (JP) ................................. 2012-181006

(51) Int. Cl.
| | |
|---|---|
| H01L 41/08 | (2006.01) |
| H03H 9/25 | (2006.01) |
| H03H 9/05 | (2006.01) |
| H03H 3/08 | (2006.01) |
| H03H 3/02 | (2006.01) |
| H03H 9/64 | (2006.01) |
| H03H 9/145 | (2006.01) |
| C04B 37/02 | (2006.01) |

(52) U.S. Cl.
CPC ............... *H03H 9/64* (2013.01); *H03H 9/0538* (2013.01); *H03H 3/08* (2013.01); *H03H 3/02* (2013.01); *H03H 9/145* (2013.01); *H03H 9/25* (2013.01); *C04B 37/02* (2013.01)
USPC ..................................................... 310/313 R (58) Field of Classification Search
CPC ....... H03H 9/05; H03H 9/0538; H03H 9/145; H03H 9/25

USPC .......................................................... 310/313
See application file for complete search history.

(56) References Cited

U.S. PATENT DOCUMENTS

| 4,568,848 | A | * | 2/1986 | Ogawa ....................... 310/313 B |
| 5,079,472 | A | * | 1/1992 | Uhl et al. ...................... 310/332 |

(Continued)

FOREIGN PATENT DOCUMENTS

| JP | 09-092895 A | 4/1997 |
| JP | 2001-053579 A | 2/2001 |

(Continued)

OTHER PUBLICATIONS

Office Action from Korean patent App. No. 10-2014-7002418 dated Apr. 22, 2014, with English language translation thereof.

(Continued)

*Primary Examiner* — J. San Martin
(74) *Attorney, Agent, or Firm* — Cermak Nakajima & McGowan LLP; Tomoko Nakajima (57) ABSTRACT

In a composite substrate 10, a bonding surface 21 of a piezoelectric substrate 20 is an irregular surface which is partially planarized. The irregular surface which is partially planarized includes a plurality of protrusions 23, each having a flat portion 25 on the tip thereof. The piezoelectric substrate 20 and the supporting substrate 30 are directly bonded to each other at the flat portions 25. By forming the bonding surface 21 into an irregular surface (rough surface) and providing flat portions 25 at the same time, it is possible to secure a sufficient contact area between the piezoelectric substrate 20 and the supporting substrate 30. Accordingly, in the composite substrate in which the piezoelectric substrate 20 and the supporting substrate 30 are bonded to each other, the bonding surface 21 can be roughened and direct bonding can be performed.

3 Claims, 6 Drawing Sheets

(56) References Cited

U.S. PATENT DOCUMENTS

| | | | |
|---|---|---|---|
| 5,329,208 A * | 7/1994 | Imai et al. | 310/313 R |
| 5,355,568 A * | 10/1994 | Imai et al. | 29/25.35 |
| 5,759,753 A | 6/1998 | Namba et al. | |
| 6,320,296 B1 * | 11/2001 | Fujii et al. | 310/313 A |
| 6,661,152 B2 * | 12/2003 | Ishibashi et al. | 310/313 A |
| 7,122,938 B2 * | 10/2006 | Noguchi et al. | 310/313 A |
| 7,148,769 B2 * | 12/2006 | Takano | 333/193 |
| 7,233,094 B2 * | 6/2007 | Akiyama et al. | 310/311 |
| 7,986,017 B2 * | 7/2011 | Takizawa et al. | 257/414 |
| 8,115,365 B2 * | 2/2012 | Suzuki et al. | 310/313 R |
| 8,253,301 B2 * | 8/2012 | Nishino et al. | 310/313 D |
| 8,339,015 B2 * | 12/2012 | Iwamoto et al. | 310/313 R |
| 8,449,083 B2 * | 5/2013 | Fujii et al. | 347/68 |
| 8,601,657 B2 * | 12/2013 | Ito | 29/25.35 |
| 8,614,535 B2 * | 12/2013 | Tsuji et al. | 310/313 R |
| 8,729,771 B2 * | 5/2014 | Kobayashi et al. | 310/313 R |
| 8,736,141 B2 * | 5/2014 | Iwamoto | 310/313 R |
| 2008/0024037 A1 * | 1/2008 | Tamura et al. | 310/313 A |
| 2010/0187949 A1 * | 7/2010 | Pahl et al. | 310/313 R |
| 2011/0309720 A1 * | 12/2011 | Kawahara | 310/313 R |
| 2012/0086312 A1 | 4/2012 | Kobayashi et al. | |
| 2013/0038176 A1 * | 2/2013 | Horikiri et al. | 310/360 |
| 2013/0249354 A1 * | 9/2013 | Watanabe et al. | 310/369 |
| 2014/0055008 A1 * | 2/2014 | Ito | 310/348 |

FOREIGN PATENT DOCUMENTS

| | | |
|---|---|---|
| JP | 2003-124767 A | 4/2003 |
| JP | 2003-188209 A | 7/2003 |
| JP | 2008-054276 A | 3/2008 |
| JP | 2010-536217 A | 11/2010 |
| JP | 2011-019043 A | 1/2011 |
| JP | 2012-015767 A | 1/2012 |
| JP | 2012-085286 A | 4/2012 |
| KR | 10-2012-0035900 A | 4/2012 |

OTHER PUBLICATIONS

International Search Report and Written Opinion for PCT Patent App. No. PCT/JP2013/069198 (Oct. 1, 2013) with Verified English language translation of the Written Opinion.

* cited by examiner

COMPOSITE SUBSTRATE WITH PARTIALLY PLANARIZED IRREGULAR SURFACE

BACKGROUND OF THE INVENTION

1. Field of the Invention

The present invention relates to a composite substrate, a surface acoustic wave device, and a method for manufacturing a composite substrate.

2. Description of the Related Art

Composite substrates having a structure in which a supporting substrate and a piezoelectric substrate are bonded to each other are known. Such composite substrates are used, for example, for surface acoustic wave devices in which a comb-shaped electrode capable of exciting a surface acoustic wave is disposed on a surface of a piezoelectric substrate. In the case of a composite substrate in which a piezoelectric substrate and a supporting substrate are bonded to each other at bonding surfaces which are mirror surfaces, reflection of bulk waves occurs at the interface because of a difference in acoustic impedance between the piezoelectric substrate and the supporting substrate. Reflected bulk waves reach the surface of the piezoelectric substrate again and are detected as signals by the electrode. Reflection of unwanted bulk waves in such a manner will degrade the characteristics of the surface acoustic wave device. As one of countermeasures against this problem, by roughening the back surface of the piezoelectric substrate, i.e., the surface in contact with the supporting substrate, bulk waves are scattered so as to prevent the degradation of the characteristics. For example, Patent Literature 1 describes that, in a surface acoustic wave element having a structure in which a piezoelectric substrate and a supporting substrate are bonded to each other by an adhesion layer, by forming fine irregularities on a surface (back surface) of the piezoelectric substrate to be bonded to the supporting substrate, generation of spurious signals can be suppressed.

CITATION LIST

Patent Literature

PTL 1: Japanese Unexamined Patent Application Publication No. 2001-53579

SUMMARY OF INVENTION

Technical Problem

In Patent Literature 1, the piezoelectric substrate and the supporting substrate are bonded (indirectly bonded) to each other by the adhesion layer. Accordingly, the heat resistance is poor compared with a composite substrate in which a piezoelectric substrate and a supporting substrate are directly bonded to each other, which is a problem. Furthermore, as in Patent Literature 1, in the case where the back surface of the piezoelectric substrate is roughened, it is not possible to secure a sufficient contact area between the piezoelectric substrate and the supporting substrate, and it is difficult to directly bond the two substrates to each other. That is, it is not possible to achieve both direct bonding between the piezoelectric substrate and the supporting substrate and roughening of the back surface of the piezoelectric substrate simultaneously.

The present invention has been achieved in order to solve such problems, and it is a main object of the present invention to provide a composite substrate in which a piezoelectric substrate and a supporting substrate are bonded to each other, in which a bonding surface is roughened and direct bonding is performed.

Solution to Problem

In order to achieve the main object described above, the present invention provides the following solution.

A composite substrate of the present invention includes: a piezoelectric substrate; and a supporting substrate directly bonded to the piezoelectric substrate, wherein at least one of a bonding surface of the piezoelectric substrate and a bonding surface of the supporting substrate is an irregular surface which is partially planarized, the irregular surface which is partially planarized includes a plurality of protrusions, each having a flat portion on the tip thereof, and the piezoelectric substrate and the supporting substrate are directly bonded to each other at the flat portions.

In the composite substrate of the present invention, at least one of the bonding surface of the piezoelectric substrate and the bonding surface of the supporting substrate is an irregular surface which is partially planarized. The irregular surface which is partially planarized includes a plurality of protrusions, each having a flat portion on the tip thereof. The piezoelectric substrate and the supporting substrate are directly bonded to each other at the flat portions. By forming the bonding surface into an irregular surface (rough surface) and providing flat portions at the same time, it is possible to secure a sufficient contact area between the piezoelectric substrate and the supporting substrate. Accordingly, in the composite substrate in which the piezoelectric substrate and the supporting substrate are bonded to each other, the bonding surface can be roughened and direct bonding can be performed. Furthermore, it is possible to obtain a surface acoustic wave device in which heat resistance is enhanced by performing direct bonding without using an adhesive, and also bulk waves are scattered because of the roughened bonding surface, thus improving characteristics. In this case, only one of the bonding surface of the piezoelectric substrate and the bonding surface of the supporting substrate may be the irregular surface which is partially planarized, and the other bonding surface may be a mirror surface. In this case, the composite substrate of the present invention may be a substantially disk-shaped wafer and may have an orientation flat (OF). Furthermore, the composite substrate of the present invention may be in a state cut out from a wafer.

In the composite substrate of the present invention, the bonding surface of the piezoelectric substrate may be the irregular surface which is partially planarized. In such a case, the effect of scattering bulk waves is enhanced, for example, compared with the case where the bonding surface of the piezoelectric substrate is a mirror surface and the bonding surface of the supporting substrate is an irregular surface which is partially planarized.

In the composite substrate of the present invention, an arithmetic average roughness Ra of the flat portions may be 1 nm or less. In such a case, since the contact area between the piezoelectric substrate and the supporting substrate is more sufficiently secured, more sufficient bonding power can be obtained during direct bonding between the piezoelectric substrate and the supporting substrate. In this case, in the irregular surface which is partially planarized, the arithmetic average roughness Ra of the flat portions may be 1 nm or less and an arithmetic average roughness Ra of portions other than the flat portions may be 10 nm or more. By setting the arithmetic average roughness Ra of portions other than the flat portions in the irregular surface which is partially planarized to 10 nm or more, the effect of scattering bulk waves becomes satisfactory. Therefore, it is possible to achieve both securing of bonding power between the piezoelectric substrate and the supporting substrate and scattering of bulk waves simultaneously.

In the composite substrate of the present invention, the percentage of the area of the flat portions in the area of the irregular surface which is partially planarized may be 30% to 80%. By setting the percentage of the area of the flat portions to 30% or more, bonding power between the piezoelectric substrate and the supporting substrate can be sufficiently secured. Furthermore, by setting the percentage of the area of the flat portions to 80% or less, the effect of scattering bulk waves can be made satisfactory. Note that the area of the irregular surface which is partially planarized is defined as the area of the irregular surface which is partially planarized obtained by projecting the irregular surface which is partially planarized to a plane perpendicular to the thickness direction of the composite substrate. Similarly, the area of the flat portions is defined as the area of the flat portions obtained by projecting the flat portions to a plane perpendicular to the thickness direction of the composite substrate.

A surface acoustic wave device according to the present invention includes the composite substrate of the present invention according to any one of the embodiments described above, and an electrode which is disposed on the piezoelectric substrate and capable of exciting a surface acoustic wave.

The surface acoustic wave device of the present invention includes the composite substrate according to any one of the embodiments described above. That is, the surface acoustic wave device includes the composite substrate in which the bonding surface is roughened and direct bonding is performed. Accordingly, the heat resistance of the surface acoustic wave device is enhanced by direct bonding performed without using an adhesive, and also bulk waves are scattered because of the roughened bonding surface, thus improving characteristics of the surface acoustic wave device.

A method of the present invention is a method for manufacturing a composite substrate by preparing a piezoelectric substrate and a supporting substrate and directly bonding the two substrates to each other at bonding surfaces, the method includes:

(a) a step of preparing the piezoelectric substrate and the supporting substrate;

(b) a step of forming at least one of the bonding surface of the piezoelectric substrate and the bonding surface of the supporting substrate into an irregular surface which is partially planarized including a plurality of protrusions, each having a flat portion on the tip thereof; and (c) a step of directly bonding the bonding surface of the piezoelectric substrate and the bonding surface of the supporting substrate to each other.

In the method for manufacturing a composite substrate according to the present invention, a piezoelectric substrate and a supporting substrate are prepared. At least one of the bonding surface of the piezoelectric substrate and the bonding surface of the supporting substrate is formed into an irregular surface which is partially planarized including a plurality of protrusions, each having a flat portion on the tip thereof. Then, the bonding surface of the piezoelectric substrate and the bonding surface of the supporting substrate are directly bonded to each other. Accordingly, by forming the bonding surface into an irregular surface and providing flat portions at the same time, it is possible to secure a sufficient contact area between the piezoelectric substrate and the supporting substrate. Thereby, it is possible to obtain a composite substrate including a piezoelectric substrate and a supporting substrate in which the bonding surface is roughened and direct bonding is performed. In the case where, in the step (b), only one of the bonding surface of the piezoelectric substrate and the bonding surface of the supporting substrate is formed into the irregular surface which is partially planarized, the other bonding surface which is a mirror surface may be prepared in the step (a), or the other bonding surface may be formed into a mirror surface by polishing in the step (b).

In the method for manufacturing a composite substrate according to the present invention, in the step (b), the bonding surface of the piezoelectric substrate may be formed into the irregular surface which is partially planarized, and in the step (c), the irregular surface which is partially planarized of the piezoelectric substrate and the bonding surface of the supporting substrate may be directly bonded to each other. In such a manner, the effect of scattering bulk waves is enhanced, for example, compared with the case where the bonding surface of the piezoelectric substrate is a mirror surface and the bonding surface of the supporting substrate is an irregular surface which is partially planarized.

In the method for manufacturing a composite substrate according to the present invention, the arithmetic average roughness Ra of the flat portions may be 1 nm or less. In such a manner, since the contact area between the piezoelectric substrate and the supporting substrate is more sufficiently secured, more sufficient bonding power can be obtained during direct bonding between the piezoelectric substrate and the supporting substrate. In this case, in the irregular surface which is partially planarized, the arithmetic average roughness Ra of the flat portions may be 1 nm or less and the arithmetic average roughness Ra of portions other than the flat portions may be 10 nm or more. By setting the arithmetic average roughness Ra of portions other than the flat portions in the irregular surface which is partially planarized to 10 nm or more, the effect of scattering bulk waves becomes satisfactory. Therefore, it is possible to achieve both securing of bonding power between the piezoelectric substrate and the supporting substrate and scattering of bulk waves simultaneously.

In the method for manufacturing a composite substrate according to the present invention, the percentage of the area of the flat portions in the area of the irregular surface which is partially planarized may be 30% to 80%. By setting the percentage of the area of the flat portions to 30% or more, bonding power between the piezoelectric substrate and the supporting substrate can be sufficiently secured. Furthermore, by setting the percentage of the area of the flat portions to 80% or less, the effect of scattering bulk waves can be made satisfactory.

In the method for manufacturing a composite substrate according to the present invention, when the piezoelectric substrate and the supporting substrate are prepared in the step (a), at least one of the piezoelectric substrate and the supporting substrate may be prepared so as to have an irregular surface as the bonding surface, and in the step (b), by polishing the irregular surface, the irregular surface may be formed into the irregular surface which is partially planarized. In this case, in the step (a), by roughening the surface of at least one of the piezoelectric substrate and the supporting substrate, the substrate having an irregular surface as the bonding surface may be prepared.

In the method for manufacturing a composite substrate according to the present invention, when the piezoelectric substrate and the supporting substrate are prepared in the step (a), at least one of the piezoelectric substrate and the supporting substrate may be prepared so as to have a mirror surface as the bonding surface, and in the step (b), by roughening the at least one mirror surface, the mirror surface may be formed into the irregular surface which is partially planarized. In this case, by polishing the surface of at least one of the piezoelectric substrate and the supporting substrate, the substrate having a mirror surface as the bonding surface may be prepared. Furthermore, in the step (b), by covering portions of the mirror surface with a mask, roughening portions not covered with the mask, and then removing the mask, the mirror surface may be formed into the irregular surface which is partially planarized. In such a manner, it is possible to leave the portions covered with the mask as flat portions more reliably.

DESCRIPTION OF EMBODIMENTS

Figure 1:
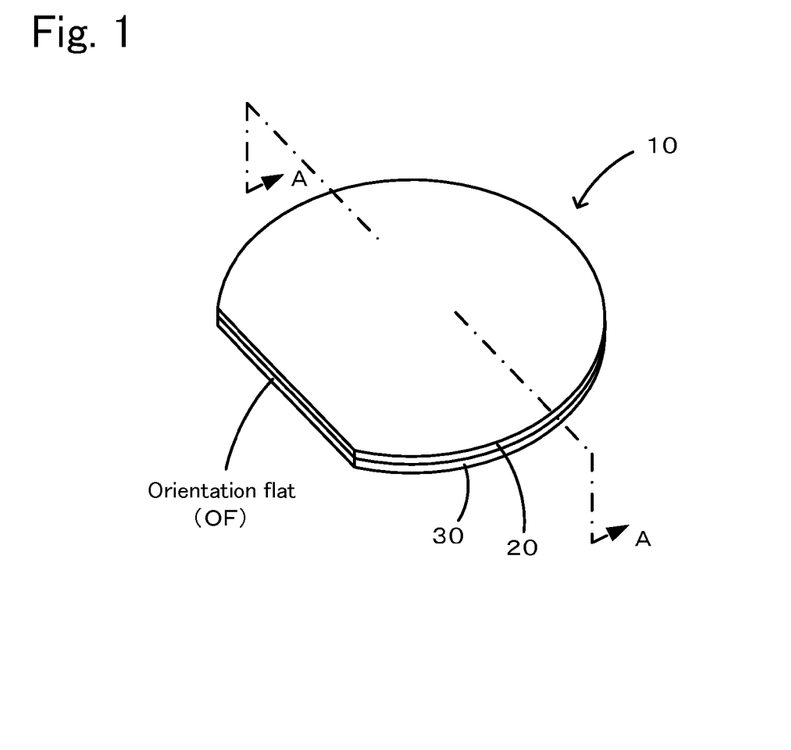
FIG. 1 is a perspective view of a composite substrate 10.
Figure 2:
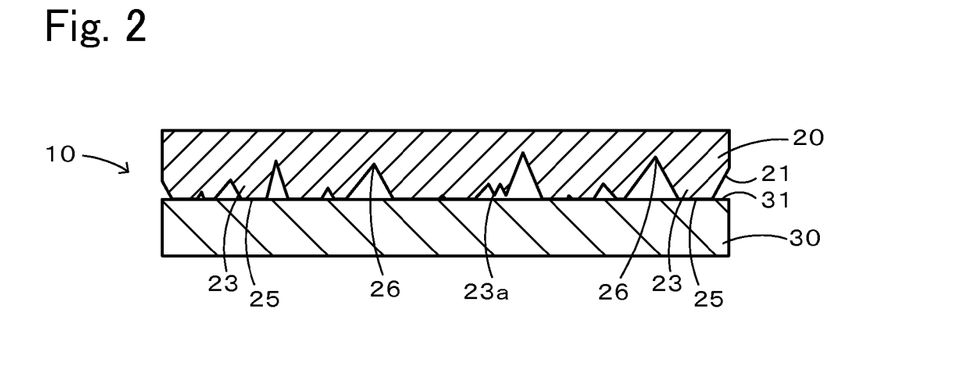
FIG. 2 is a cross-sectional view taken along the line A-A of FIG. 1.

Embodiments of the present invention will be described below with reference to the drawings. FIG. 1 is a perspective view of a composite substrate 10 according to an embodiment of the present invention. FIG. 2 is a cross-sectional view taken along the line A-A of FIG. 1. The composite substrate 10 is used, for example, in a surface acoustic wave device and formed into a circular shape including a flat portion. The flat portion is referred to as the "orientation flat (OF)" and used for detecting the position and direction of the wafer, for example, when various operations are performed in the surface acoustic wave device fabrication process. The composite substrate 10 according to this embodiment includes a piezoelectric substrate 20 and a supporting substrate 30.

The piezoelectric substrate 20 is a substrate formed of a piezoelectric body capable of propagating surface acoustic waves. Examples of a material for the piezoelectric substrate 20 include lithium tantalate ($LiTaO_3$, also expressed as "LT"), lithium niobate ($LiNbO_3$, also expressed as "LN"), a LN-LT solid solution single crystal, lithium borate, langasite, quartz, and the like. The size of the piezoelectric substrate 20 is not particularly limited. For example, the piezoelectric substrate 20 has a diameter of 50 to 150 mm and a thickness of 10 to 50 μm. In the piezoelectric substrate 20, the lower surface shown in FIG. 2 is a bonding surface 21 provided with fine irregularities. The piezoelectric substrate 20 is directly bonded to a bonding surface 31 of the supporting substrate 30 at the bonding surface 21.

The bonding surface 21 is a rough surface and, as shown in FIG. 2, is an irregular surface which is partially planarized, including a plurality of protrusions 23, each having a flat portion 25 on the tip thereof, a plurality of protrusions 23a, each having no flat portion 25, and a plurality of recesses 26. The piezoelectric substrate 20 is directly bonded to the supporting substrate 30 at the flat portions 25 of the bonding surface 21. The flat portion 25 is a plane parallel (including substantially parallel) to the surface of the piezoelectric substrate 20, and is located at the top of the altitude of the protrusion 23 to which it belongs (the lowest part in FIG. 2). Here, the term "altitude" refers to the distance (height) in the thickness direction of the piezoelectric substrate 20 based on the surface (upper surface in FIG. 2) opposite the bonding surface 21. Furthermore, the plurality of flat portions 25 are positioned on the same plane (including substantially the same plane). The arithmetic average roughness Ra of the flat portions 25 is preferably 1 nm or less from the viewpoint that bonding power is sufficiently secured during direct bonding between the bonding surface 21 and the bonding surface 31. However, the arithmetic average roughness Ra of the flat portions 25 is not limited thereto, and may be any value as long as the contact area with the bonding surface 31 is sufficiently secured and sufficient bonding power can be obtained during direct bonding between the bonding surface 21 and the bonding surface 31. In the protrusion 23a, the altitude of the tip (peak) is lower than the altitude of the flat portions 25. That is, the tip of the protrusion 23a is located at an upper position than the flat portions 25 in FIG. 2. Furthermore, the maximum height roughness Rz of the bonding surface 21 is not particularly limited and, for example, is 1 to 5 μm. The arithmetic average roughness Ra of the bonding surface 21 is not particularly limited and, for example, is 0.1 to 0.5 μm. Furthermore, the arithmetic average roughness Ra of portions other than the flat portions 25 (rough surface portions) is preferably 10 nm or more from the viewpoint that the effect of scattering bulk waves becomes satisfactory. From the viewpoint that it is possible to achieve both securing of bonding power between the bonding surface 21 and the bonding surface 31 and scattering of bulk waves simultaneously, preferably, the arithmetic average roughness Ra of the flat portions 25 is 1 nm or less and the arithmetic average roughness Ra of portions other than the flat portions 25 is 10 nm or more. Furthermore, preferably, the percentage of the area of the flat portions 25 in the area of the bonding surface 21 (irregular surface which is partially planarized) is 30% to 80%. By setting the percentage of the area of the flat portions 25 to 30% or more, bonding power between the bonding surface 21 and the bonding surface 31 can be sufficiently secured. Furthermore, by setting the percentage of the area of the flat portions 25 to 80% or less, the effect of scattering bulk waves can be made satisfactory. Note that the area of the bonding surface 21 is defined as the area of the bonding surface 21 obtained by projecting the bonding surface 21 to a plane (plane extending in the right-left direction in FIG. 2) perpendicular to the thickness direction of the composite substrate 10 (piezoelectric substrate 20). Similarly, the area of the flat portions 25 is defined as the area of the flat portions 25 obtained by projecting the flat portions 25 to a plane perpendicular to the thickness direction of the composite substrate 10 (piezoelectric substrate 20).

Furthermore, the presence of the flat portions 25 in the bonding surface 21 can be confirmed by observing the bonding surface 21, for example, with an atomic force microscope (AFM), a stylus-type profilometer, an optical non-contact profilometer, or the like.

The supporting substrate 30 has the bonding surface 31 on the upper side in FIG. 2 and is directly bonded to the bonding surface 21 of the piezoelectric substrate 20 at the bonding surface 31. Examples of a material for the supporting substrate 30 include silicon (Si), sapphire, aluminum nitride, alumina, borosilicate glass, quartz glass, and the like. The size of the supporting substrate 30 is not particularly limited. For example, the supporting substrate 30 has a diameter of 50 to 150 mm and a thickness of 100 to 500 µm. Furthermore, when a material having a coefficient of thermal expansion close to that of the piezoelectric substrate 20 is used for the supporting substrate 30, warpage of the composite substrate during heating can be suppressed. The bonding surface 31 is a mirror surface. The arithmetic average roughness Ra of the bonding surface 31 is preferably 1 nm or less from the viewpoint that bonding power between the bonding surface 21 and the bonding surface 31 can be sufficiently secured during direct bonding. However, the arithmetic average roughness Ra of the bonding surface 31 is not limited thereto, and may be any value as long as the contact area with the bonding surface 21 (flat portions 25) is sufficiently secured and sufficient bonding power can be obtained during direct bonding between the bonding surface 21 and the bonding surface 31.

A method for manufacturing such a composite substrate 10 will be described below with reference to FIG. 3. FIG. 2 includes explanatory views (cross-sectional views) schematically showing steps of manufacturing a composite substrate 10. The method for manufacturing a composite substrate 10 includes (a) a step of preparing a piezoelectric substrate 120 and a supporting substrate 30, in which by roughening a surface of the piezoelectric substrate 120, a bonding surface 121 is formed into an irregular surface; (b) a step of forming the bonding surface 121 into an irregular surface which is partially planarized including a plurality of protrusions, each having a flat portion 25 on the tip thereof, by polishing the bonding surface 121, i.e., the irregular surface; and (c) a step of directly bonding a bonding surface 21, i.e., the irregular surface which is partially planarized, and a bonding surface 31 of the supporting substrate 30 to each other.

Figure 3:
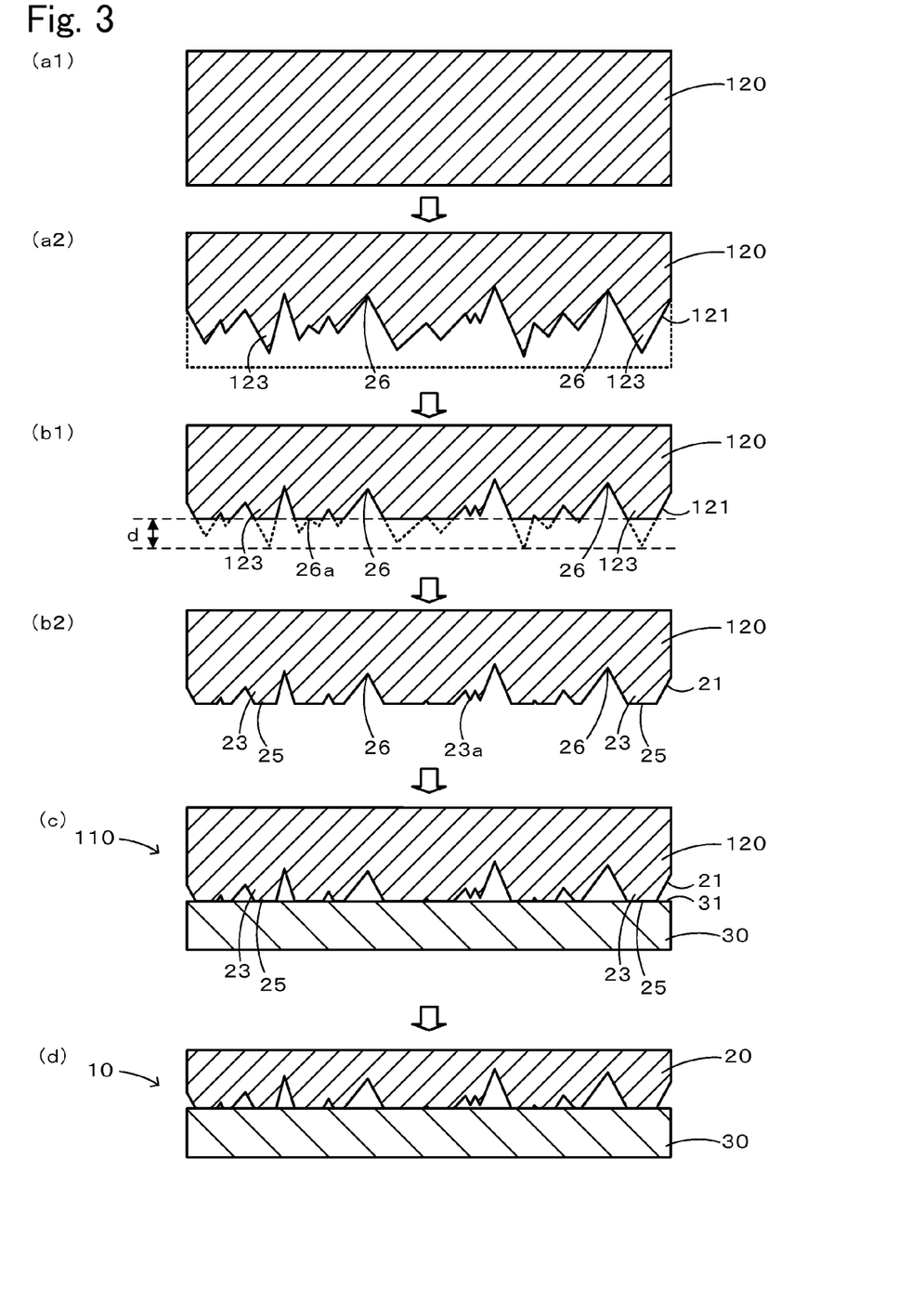
FIG. 3 includes explanatory views (cross-sectional views) schematically showing steps of manufacturing a composite substrate 10.

In the step (a), first, a piezoelectric substrate 120 which has an OF and is to be formed into a piezoelectric substrate 20, and a supporting substrate 30 are prepared (FIG. 3(a1)). In FIG. 3(a1), the supporting substrate 30 is not shown. The size of the piezoelectric substrate 120 is not particularly limited. For example, the piezoelectric substrate 120 can have a diameter of 50 to 150 mm and a thickness of 150 to 500 µm. The size of the supporting substrate 30 can be the same as that of the piezoelectric substrate 120. Regarding the supporting substrate 30, a supporting substrate in which the bonding surface 31 in advance has an arithmetic average roughness Ra of the value described above (e.g., 1 nm or less) may be prepared, or the bonding surface 31 may be mirror-polished by CMP polishing so as to have an arithmetic average roughness Ra of the value described above (e.g., 1 nm or less). Subsequently, by roughening one surface of the piezoelectric substrate 120, a bonding surface 121 is formed. The bonding surface 121 is formed into an irregular surface having a plurality of protrusions 123 and a plurality of recesses 26 (FIG. 3(a2)). The bonding surface 121 is formed, for example, so as to have a maximum height roughness Rz of about 3 µm, although not limited thereto. Furthermore, roughening may be performed such that the arithmetic average roughness Ra of the bonding surface 121 is about the same as the wavelength of the surface acoustic wave used when the composite substrate 10 is used as a surface acoustic wave device. Alternatively, the surface of the piezoelectric substrate 120 may be roughened such that the effect of scattering bulk waves becomes satisfactory (for example, the arithmetic average roughness Ra of the bonding surface 121 is 10 nm or more). The formation of the bonding surface 121 is performed, for example, by roughening the surface of the piezoelectric substrate 120 by a lapping machine or sandblasting. Furthermore, the bonding surface 121 may be formed by wet etching using hydrofluoric acid or the like. In such a manner, in the step (a), the piezoelectric substrate 120 is prepared by roughening so that the bonding surface 121 is formed into an irregular surface.

In the step (b), by polishing the bonding surface 121, i.e., the irregular surface (FIG. 3(b1)), the bonding surface 121 is formed into an irregular surface which is partially planarized including a plurality of protrusions 123, each having a flat portion on the tip thereof. Thereby, in the bonding surface 21 after being polished, each of a plurality of protrusions 23 has a flat portion 25 on the tip thereof (FIG. 3(b2)). The polishing is performed such that at least some of the recesses 26 of the bonding surface 121 remain and tips of at least some of the protrusions 123 are planarized. Examples of the polishing method include CMP polishing using a non-woven pad or slurry. Furthermore, a plurality of polishing processes may be performed; for example, after the bonding surface 121 is subjected to lapping using diamond abrasive grains or the like, CMP polishing may be performed. Thereby, a plurality of flat portions 25 are formed on the same plane (including substantially the same plane). The polishing is performed such that the arithmetic average roughness Ra of the flat portions 25 is set to the value described above. Here, a polishing depth d is defined by the distance in the thickness direction of the piezoelectric substrate 120 between the altitude of the highest portion of the bonding surface 121 before being polished (the highest altitude among the peaks of a plurality of protrusions 123 of the bonding surface 121) and the altitude of the flat portions 25 of the bonding surface 21 after being polished (refer to FIG. 3(b1)). Although not particularly limited, the bonding surface 121 is polished, for example, such that the polishing depth d is 0.5 to 3 µm. The polishing depth d is not limited thereto, and may be determined, for example, by an experiment such that the bonding surface 121 after being polished, i.e., the bonding surface 21, can sufficiently secure bonding power with the bonding surface 31 of the supporting substrate 30, and, in the case where the composite substrate 10 is used in a surface acoustic wave device, a rough surface that can scatter bulk waves is obtained. Furthermore, as shown in FIG. 3(b1), there may be a recess 26a which disappears after polishing because it has a valley shallower than the polishing depth d. Furthermore, as shown in FIG. 3(b2), there may be a protrusion 23a whose tip is not planarized by polishing in the bonding surface 121 after being polished. Furthermore, preferably, the irregular surface is polished in the step (b) such that the percentage of the area of the flat portions 25 in the area of the bonding surface 21 (irregular surface which is partially planarized) is the value described above (30% to 80%).

As described above, in the method of manufacturing a composite substrate 10 according to this embodiment, two steps are carried out, i.e., forming an irregular surface as the bonding surface 121 in the step (a) and cutting the tips (tops) of protrusions 123 by polishing in the subsequent step (b). Thereby, the bonding surface 21 (irregular surface which is partially planarized) including protrusions 23, each having a flat portion 25 on the tip thereof, can be relatively easily formed.

In the step (c), the bonding surface 21, i.e., the bonding surface 121 after being polished, and the bonding surface 31 of the supporting substrate 30 are directly bonded to each other to form a bonded substrate 110 (FIG. 3(c)). As the method for direct bonding, the following method can be exemplified. That is, first, the bonding surface 21 of the piezoelectric substrate 120 and the bonding surface 31 of the supporting substrate 30 are washed to remove impurities (oxides, adsorbates, and the like) attached to the bonding surfaces 21 and 31. Next, by irradiating the bonding surfaces 21 and 31 of the two substrates with ion beams of inert gas, such as argon, remaining impurities are removed and the bonding surfaces 21 and 31 are activated. Then, the two substrates are bonded to each other, in vacuum, at normal temperature. In this process, since the bonding surface 21 is, although being roughened, an irregular surface which is partially planarized and has the flat portions 25, it is possible to secure a sufficient contact area between the piezoelectric substrate 120 and the supporting substrate 30. Therefore, even though the bonding surface 21 is roughened, sufficient bonding power can be secured, and direct bonding is made possible.

After the bonded substrate 110 is formed, in a step (d), the surface (upper surface) of the piezoelectric substrate 120 is ground to reduce its thickness, and is subjected to mirror polishing (FIG. 3(d)). Thereby, the piezoelectric substrate 120 is formed into the piezoelectric substrate 20 shown in FIGS. 1 and 2, and the composite substrate 10 is obtained.

Figure 4:
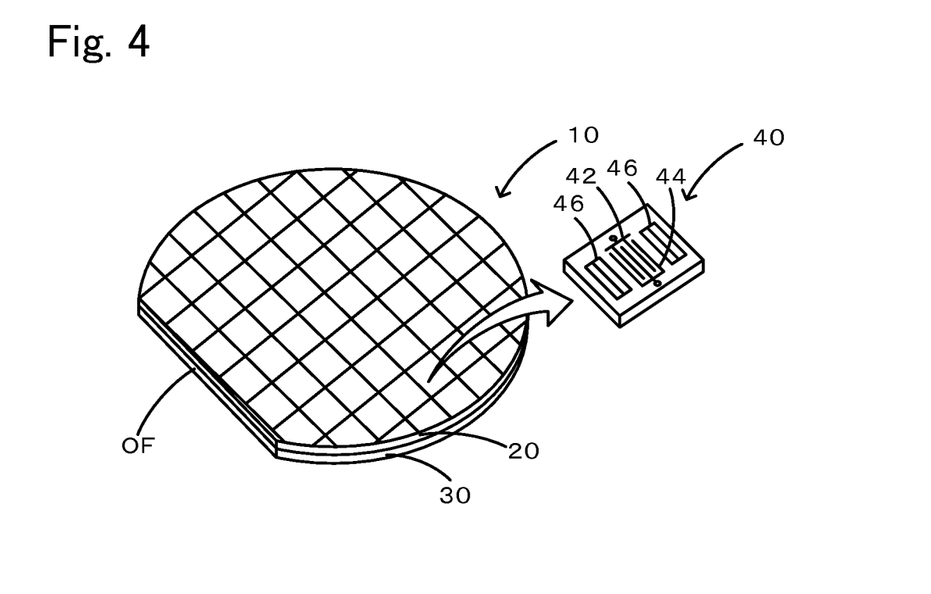
FIG. 4 is a perspective view of a 1-port SAW resonator 40 produced using the composite substrate 10.
Figure 5:
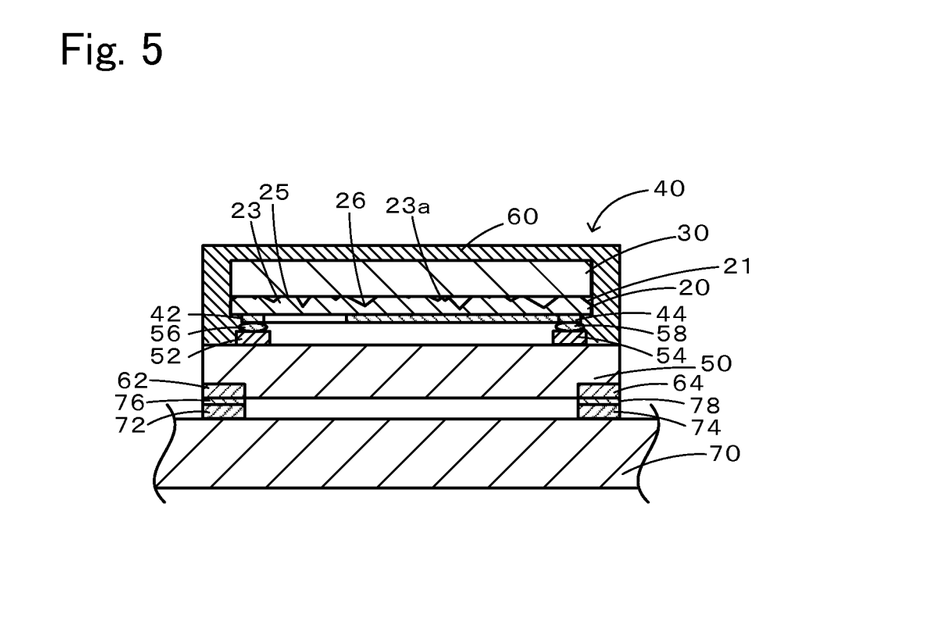
FIG. 5 is a cross-sectional view showing the 1-port SAW resonator 40 mounted on a ceramic substrate 50, sealed with a resin, and further mounted on a printed circuit board 70.

The composite substrate 10 thus obtained is formed into an assemblage of many surface acoustic wave devices, using a common photolithographic technique, and then, cut into individual surface acoustic wave devices by dicing. FIG. 4 shows the state in which the composite substrate 10 is formed into an assemblage of 1-port SAW resonators 40 which are surface acoustic wave devices. The 1-port SAW resonator 40 includes a pair of IDT (interdigital transducer) electrodes 42 and 44 (also referred to as comb-shaped electrodes or interdigital electrodes) capable of exciting a surface acoustic wave and reflecting electrodes 46 formed by a photolithographic technique on the surface of the piezoelectric substrate 20. The resulting 1-port SAW resonator 40 is mounted on a printed circuit board 70 in the following manner. That is, as shown in FIG. 5, the IDT electrodes 42 and 44 and pads 52 and 54 of a ceramic substrate 50 are connected to each other through gold balls 56 and 58, respectively, and then the device is sealed by a resin 60 on the ceramic substrate 50. A lead-free solder paste is interposed between electrodes 62 and 64 provided on the back surface of the ceramic substrate 50 and pads 72 and 74 of the printed circuit board 70, and then the device is mounted on the printed circuit board 70 by a reflow process. FIG. 4 shows solder portions 76 and 78 after the solder paste has been melted and re-solidified.

An example of use of the 1-port SAW resonator 40 thus produced will be described below. When a voltage is applied between the IDT electrodes 42 and 44, a surface acoustic wave is excited on the surface of the piezoelectric substrate 20, and the surface acoustic wave propagates on the surface of the piezoelectric substrate 20 from the IDT electrodes 42 and 44 toward the reflecting electrodes 46 on both sides. The surface acoustic wave is reflected by the reflecting electrodes 46 back to the IDT electrodes 42 and 44. Thus, the 1-port SAW resonator 40 operates as a resonator having a resonant frequency f, which is obtained from the expression: resonant frequency f=propagation speed v/cycle λ, where λ denotes the frequency of the IDT electrodes 42 and 44, and v denotes the propagation speed of the surface acoustic wave on the surface of the piezoelectric substrate 20. Here, when a voltage is applied between the IDT electrodes 42 and 44, waves (bulk waves) in the thickness direction of the piezoelectric substrate 20 are also generated in addition to the surface acoustic wave. When the bulk waves are reflected at the interface between the piezoelectric substrate 20 and the supporting substrate 30 and reach the surface of the piezoelectric substrate 20, noise is generated to the surface acoustic wave, resulting in degradation in the characteristics of the 1-port SAW resonator 40. In the composite substrate 10 according to this embodiment, since the bonding surface 21 of the piezoelectric substrate 20 is an irregular surface which is partially planarized, including protrusions 23, protrusions 23a, recesses 26, the bulk waves can be scattered. Therefore, noise due to bulk waves can be reduced, and it is possible to improve the characteristics of the 1-port SAW resonator 40.

In the composite substrate 10 according to this embodiment described above in detail, the bonding surface 21 of the piezoelectric substrate 20 is an irregular surface which is partially planarized. The irregular surface which is partially planarized includes a plurality of protrusions 23, each having a flat portion 25 on the tip thereof. The piezoelectric substrate 20 and the supporting substrate 30 are directly bonded to each other at the flat portions 25. By forming the bonding surface 21 into an irregular surface (rough surface) and providing the flat portions 25 at the same time, it is possible to secure a sufficient contact area between the piezoelectric substrate 20 and the supporting substrate 30. Accordingly, in the composite substrate in which the piezoelectric substrate 20 and the supporting substrate 30 are bonded to each other, the bonding surface 21 can be roughened and direct bonding can be performed. Furthermore, by setting the arithmetic average roughness Ra of the flat portions 25 to 1 nm or less, since the contact area between the piezoelectric substrate 20 and the supporting substrate 30 is more sufficiently secured, more sufficient bonding power can be obtained during direct bonding. Furthermore, it is possible to obtain a surface acoustic wave device in which heat resistance is enhanced by performing direct bonding without using an adhesive, and also bulk waves are scattered because of the roughened bonding surface, thus improving characteristics. Furthermore, the bonding surface 21 of the piezoelectric substrate 20 is the irregular surface which is partially planarized, including the protrusions 23, each having a flat portion 25 on the tip thereof. Consequently, the effect of scattering bulk waves is enhanced, for example, compared with the case where the bonding surface of the piezoelectric substrate 20 is a mirror surface and the bonding surface of the supporting substrate 30 is an irregular surface which is partially planarized.

Furthermore, in the step (a), a piezoelectric substrate 20 having a bonding surface 121 is prepared, and in the step (b), the bonding surface 121 is formed into an irregular surface which is partially planarized by polishing the bonding surface 121. Accordingly, it is possible to relatively easily form an irregular surface which is partially planarized, including protrusions 23, each having a flat portion 25 on the tip thereof.

In this regard, it is needless to say that the present invention is not limited to the above-described embodiment and can be executed in various aspects within the technical scope of the present invention.

Figure 6:
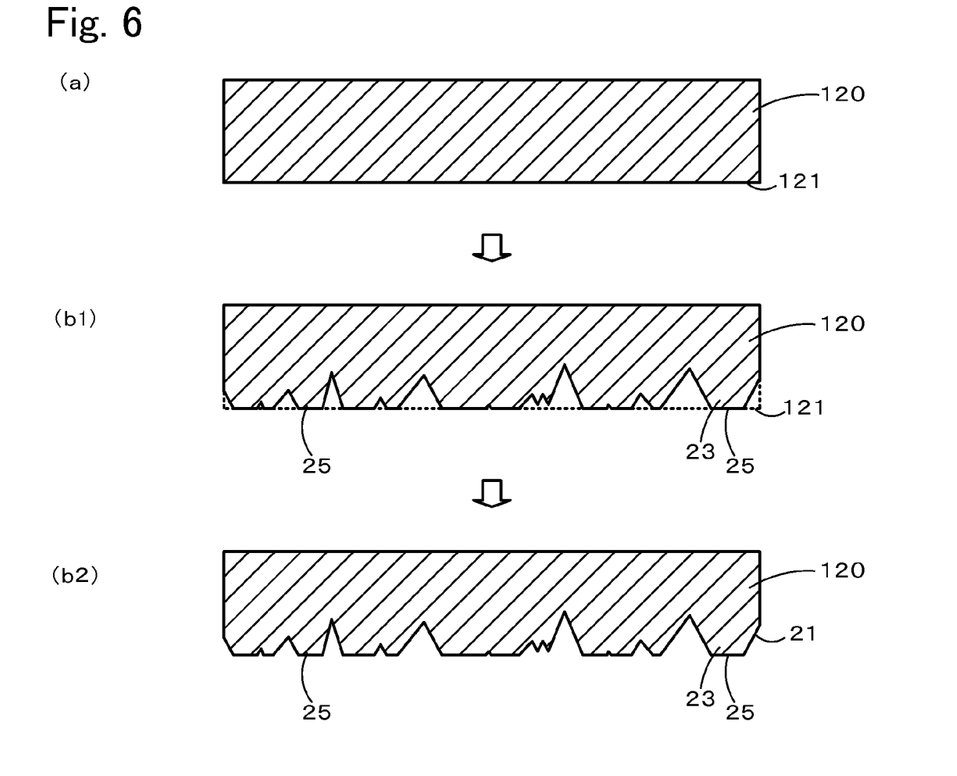
FIG. 6 includes explanatory views (cross-sectional views) schematically showing steps (a) and (b) in a modification example.

For example, in the embodiment described above, in the step (a), by roughening a surface of a piezoelectric substrate 120, a piezoelectric substrate having an irregular surface as a bonding surface 121 is prepared, and in the step (b), the bonding surface 121 is formed into an irregular surface which is partially planarized by polishing the bonding surface 121, i.e., the irregular surface. However, the method is not limited thereto, and the irregular surface which is partially planarized may be formed by another method. For example, as shown in FIG. 6, in the step (a), a piezoelectric substrate 120 having a mirror surface as a bonding surface 121 may be prepared (FIG. 6(a)), and in the step (b), by roughening the bonding surface 121 which is a mirror surface (FIG. 6(b1) and FIG. 6(b2)), the mirror surface may be formed into an irregular surface which is partially planarized (bonding surface 21). In such a manner, in the step (b), by roughening the bonding surface 121 such that at least some portions of the mirror surface remain as flat portions 25, it is also possible to form an irregular surface which is partially planarized. Note that examples of the method of roughening the bonding surface 121 in the step (b) include dry etching, sandblasting, wet etching, and the like. Furthermore, in the step (b), an irregular surface which is partially planarized may be formed by covering portions of the bonding surface 121, which are intended to remain as flat portions 25, with a mask, roughening portions not covered with the mask by dry etching, sandblasting, wet etching, or the like, and then removing the mask. In such a manner, it is possible to leave the portions covered with the mask as flat portions 25 more reliably. Furthermore, it is possible to easily control the shape of the flat portions 25 and the percentage of the area of the flat portions 25 in the area of the irregular surface which is partially planarized. As the masking method, for example, a method may be used in which a mask composed of a metal film or the like is patterned on the bonding surface 121 using a photolithographic technique or the like. The material for the mask is not limited to a metal, but may be any material that can protect the bonding surface 121 without being detached or removed in the process of roughening the bonding surface 121. The pattern of the mask may have any shape, for example, it may be linear, dot-shaped, curved, or the like. The pattern of the mask can be selected appropriately, for example, such that the percentage of the area of the flat portions 25 in the area of the irregular surface which is partially planarized is 30% to 80%. Furthermore, in the case where the bonding surface 121 is roughened such that at least some portions of the mirror surface remain as flat portions 25, instead of preparing a piezoelectric substrate 120 having a mirror surface as a bonding surface 121 in the step (a), a piezoelectric substrate having a mirror surface as a bonding surface 121 may be prepared by polishing the surface of a piezoelectric substrate in the step (a). Furthermore, in the step (a), each of the bonding surface of the piezoelectric substrate and the bonding surface of the supporting substrate may be polished to be formed into a mirror surface, and in the step (b), the bonding surface of the piezoelectric substrate only may be roughened to be an irregular surface which is partially planarized.

Figure 7:
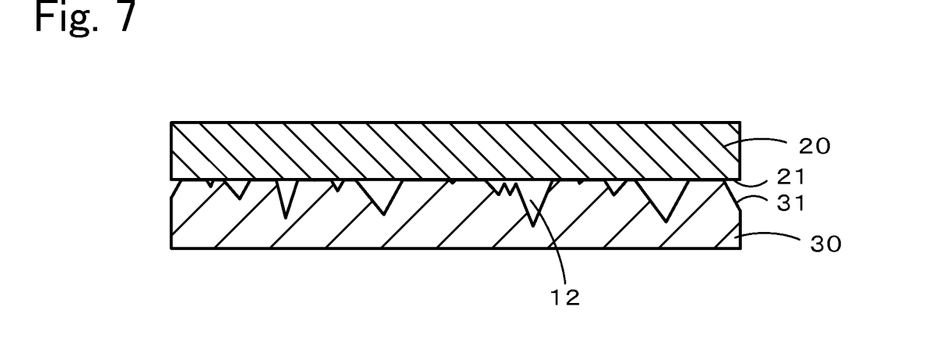
FIG. 7 is a cross-sectional view of a composite substrate in a modification example.

For example, in the embodiment described above, the bonding surface 21 of the piezoelectric substrate 20 is formed into the irregular surface which is partially planarized. However, the present invention is not limited thereto. For example, as shown in FIG. 7, a bonding surface 21 of a piezoelectric substrate 20 may be formed into a mirror surface, and a bonding surface 31 of a supporting substrate 30 may be formed into an irregular surface which is partially planarized. Even in such a case, the same effects as those of the embodiment described above can be obtained. However, the embodiment described above is likely to have a higher effect of scattering bulk waves. The composite substrate shown in FIG. 7 can be produced in accordance with the manufacturing steps for the composite substrate 10 described above. For example, in the step (a), the bonding surface of the supporting substrate, not of the piezoelectric substrate, is roughened to be an irregular surface, and in the step (b), the irregular surface of the supporting substrate is polished to be formed into an irregular surface which is partially planarized. alternatively, in the step (a), the bonding surface of the supporting substrate may be polished to be formed into a mirror surface, and in the step (b), the mirror surface of the supporting substrate may be roughened to be an irregular surface which is partially planarized.

Figure 8:
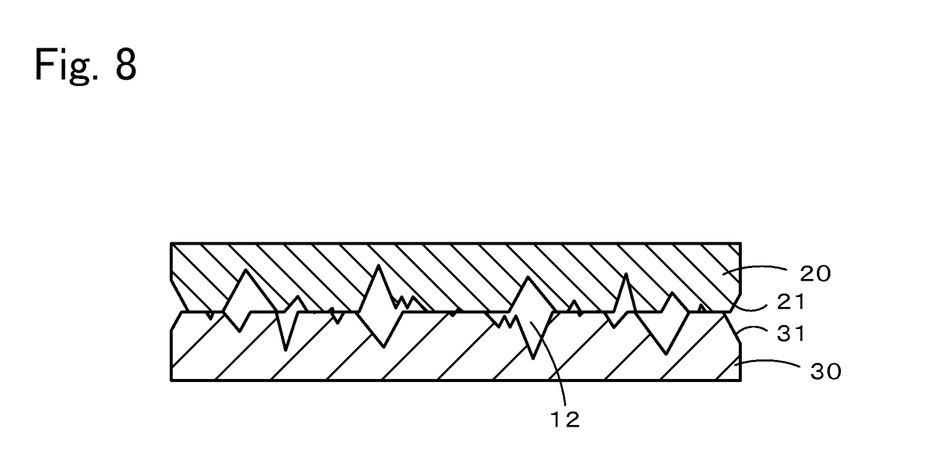
FIG. 8 is a cross-sectional view of a composite substrate in a modification example.

Alternatively, as shown in FIG. 8, each of a bonding surface 21 of a piezoelectric substrate 20 and a bonding surface 31 of a supporting substrate 30 may be formed into an irregular surface which is partially planarized. Even in such a case, the same effects as those of the embodiment described above can be obtained. However, the embodiment described above is likely to have higher bonding power during direct bonding between the piezoelectric substrate 20 and the supporting substrate 30. The composite substrate shown in FIG. 8 can be produced in accordance with the manufacturing steps for the composite substrate 10 described above. Furthermore, the irregular surface which is partially planarized of the piezoelectric substrate and the irregular surface which is partially planarized of the supporting substrate may be formed by the same method or different methods. For example, the irregular surface which is partially planarized of the piezoelectric substrate may be formed by polishing an irregular surface, and the irregular surface which is partially planarized of the supporting substrate may be formed by roughening a mirror surface.

Furthermore, in FIGS. 7 and 8, a space 12 sandwiched between the bonding surface 21 and the bonding surface 31 is preferably filled with a substance capable of transmitting bulk waves. In such a case, bulk waves are reliably transmitted to portions other than the flat portions in the bonding surface 31 of the supporting substrate, and therefore, bulk waves can be scattered more reliably. Regardless of the space 12 being filled with a substance or not, some of bulk waves that have reached the bonding interface between the piezoelectric substrate 20 and the supporting substrate 30 propagate into the supporting substrate 30. Then, bulk waves reach portions other than the flat portions 25 of the bonding surface 31. The bulk waves scattered by irregularities of the portions other than the flat portions 25 again pass through the bonding interface between the piezoelectric substrate 20 and the supporting substrate 30 and propagate into the piezoelectric substrate 20. In such a manner, even when the space 12 is not filled with a substance, bulk waves can be scattered by the irregular surface which is partially planarized on the supporting substrate 30 side, and it is possible to obtain a surface acoustic wave device having improved characteristics.

In the embodiment described above, the protrusions 23a which do not have flat portions 25 are present in the bonding surface 21 of the composite substrate 10. However, the present invention is not limited thereto. All the protrusions in the bonding surface 21 may be provided with flat portions 25, and protrusions 23a may be not present.

In the embodiment described above, in the step (a), by roughening the surface of the piezoelectric substrate 120, an irregular surface as the bonding surface 121 is formed. However, the present invention is not limited thereto. For example, in the step (a), a piezoelectric substrate 120 having an irregular surface as a bonding surface 121 in advance may be prepared.

In the embodiment described above, description has been made on the 1-port SAW resonator as a surface acoustic wave device fabricated using the composite substrate 10. Even when another surface acoustic wave device is fabricated using the composite substrate 10, the same effects can be obtained. Examples of the other surface acoustic wave device include a 2-port SAW resonator, a transversal SAW filter, a ladder SAW filter, a convolver, and the like.

EXAMPLES

Example 1

In Example 1, a composite substrate 10 shown in FIGS. 1 and 2 was produced by the manufacturing method described with reference to FIG. 3, and using the composite substrate 10, a 1-port SAW resonator 40 shown in FIG. 4 was produced.

Specifically, production was performed as follows. First, in the step (a), a LiTaO₃ substrate having an OF, with a diameter of 4 inch and a thickness of 230 μm was prepared as a piezoelectric substrate 120. By lapping the back surface of the piezoelectric substrate 120 with abrasive grains (made of green silicon carbide (GC), grain size #1000), a bonding surface 121 which was an irregular surface with a maximum height roughness Rz of 3 μm was formed. Furthermore, a Si substrate having an OF, with a diameter of 4 inch and a thickness of 250 μm was prepared as a supporting substrate 30. The supporting substrate 30 had a bonding surface 31 which had been subjected to CMP polishing in advance such that the arithmetic average roughness Ra was 1 nm or less.

Subsequently, in the step (b), using diamond abrasive grains with an average grain size of 0.5 μm, the bonding surface 121 was subjected to lapping such that the polishing depth d was about 1.0 μm. Finally, the surface was subjected to CMP polishing using a non-woven pad such that the arithmetic average roughness Ra of the flat portions 25 was 1 nm or less. Furthermore, when the bonding surface 121 after being polished (bonding surface 21) was observed with an atomic force microscope (AFM), it was confirmed that flat portions 25, protrusions 23, and recesses 26 were formed in the bonding surface 21, and thus an irregular surface which is partially planarized was formed. Furthermore, the arithmetic average roughness Ra of the flat portions 25 was 0.8 nm for a measurement area 10 μm square. The arithmetic average roughness Ra of portions other than the flat portions 25 in the bonding surface 21 was 10 nm for a measurement area 10 μm square. Furthermore, a 100 μm square region in the bonding surface 21 was observed by an AFM, and it was found that the ratio of the flat portions 25 to the portions other than the flat portions 25 was 3:7. That is, the percentage of the area of the flat portions 25 in the area of the irregular surface which is partially planarized was 30%. Since there is a large difference in the arithmetic average roughness Ra between the flat portions 25 and the portions other than the flat portions 25, there is a large difference in brightness between the flat portions 25 and the portions other than the flat portions 25 in the image obtained by observation of the bonding surface 21 with the AFM. Accordingly, by binarizing the image on the basis of the difference, a boundary can be set between the flat portions 25 and the portions other than the flat portions 25, and thus the area of the flat portions 25 can be determined. The percentage of the area of the flat portions 25 in the area of the irregular surface which is partially planarized was calculated using the AFM image in such a manner.

Next, in the step (c), the piezoelectric substrate 120 and the supporting substrate 30 were each subjected to scrubbing, acid washing, and organic cleaning in that order to clean the bonding surfaces 21 and 31. Then, the piezoelectric substrate 120 and the supporting substrate 30 were transported into an ultrahigh vacuum chamber. The bonding surfaces 21 and 31 were irradiated with neutral argon beams for about 60 seconds. The two substrates were left to stand for about 5 minutes until the surface temperatures of the bonding surfaces 21 and 31 decreased. The two substrates were brought into contact with each other, and under a pressure of 2 t, the piezoelectric substrate 120 and the supporting substrate 30 were directly bonded to each other to form a bonded substrate 110. In the step (d), the bonded substrate 110 was taken out, and the surface of the piezoelectric substrate 120 was ground/polished until the thickness of the piezoelectric substrate 120 became 20 μm to obtain a piezoelectric substrate 20. Thereby, a composite substrate 10 was produced.

Subsequently, 200 pairs of IDT electrodes 42 and 44 and reflecting electrodes 46 were formed by patterning on the piezoelectric substrate 20 of the composite substrate 10, and individual 1-port SAW resonators 40 were cut out by dicing.

Comparative Example 1

In Comparative Example 1, a composite substrate was produced as in Example 1 except that the bonding surface 21 of the piezoelectric substrate 20 was formed into a mirror surface not provided with flat portions 25 (arithmetic average roughness Ra=0.4 nm), and a 1-port SAW resonator was produced.

[Evaluation of Reflection Characteristics]

Frequency characteristics were measured on the 1-port SAW resonators of Example 1 and Comparative Example 1. When Example 1 and Comparative Example 1 were compared in terms of the peak value of the amplitude of spurious signals, in Example 1, the peak value of the amplitude of spurious signals was suppressed to a value that was 3 dB or more smaller than that of Comparative Example 1. This confirms that, in Example 1, since the bonding surface 21 of the piezoelectric substrate 20 is an irregular surface which is partially planarized, which is roughened, noise due to spurious signals, i.e., unwanted reflection of bulk waves, is suppressed by 3 dB or more compared with Comparative Example 1.

Furthermore, an attempt was made to produce a composite substrate by carrying out the same steps as those of Example 1 except that the step (b) was omitted and flat portions 25 were not formed on the piezoelectric substrate 20. As a result, even if direct bonding was performed in the step (c), the piezoelectric substrate 120 and the supporting substrate 30 could not be bonded to each other. This confirms that, in Example 1, since the bonding surface 21 of the piezoelectric substrate 20 is formed into an irregular surface which is partially planarized, bonding power during direct bonding is sufficient.

Example 2

Figure 9:
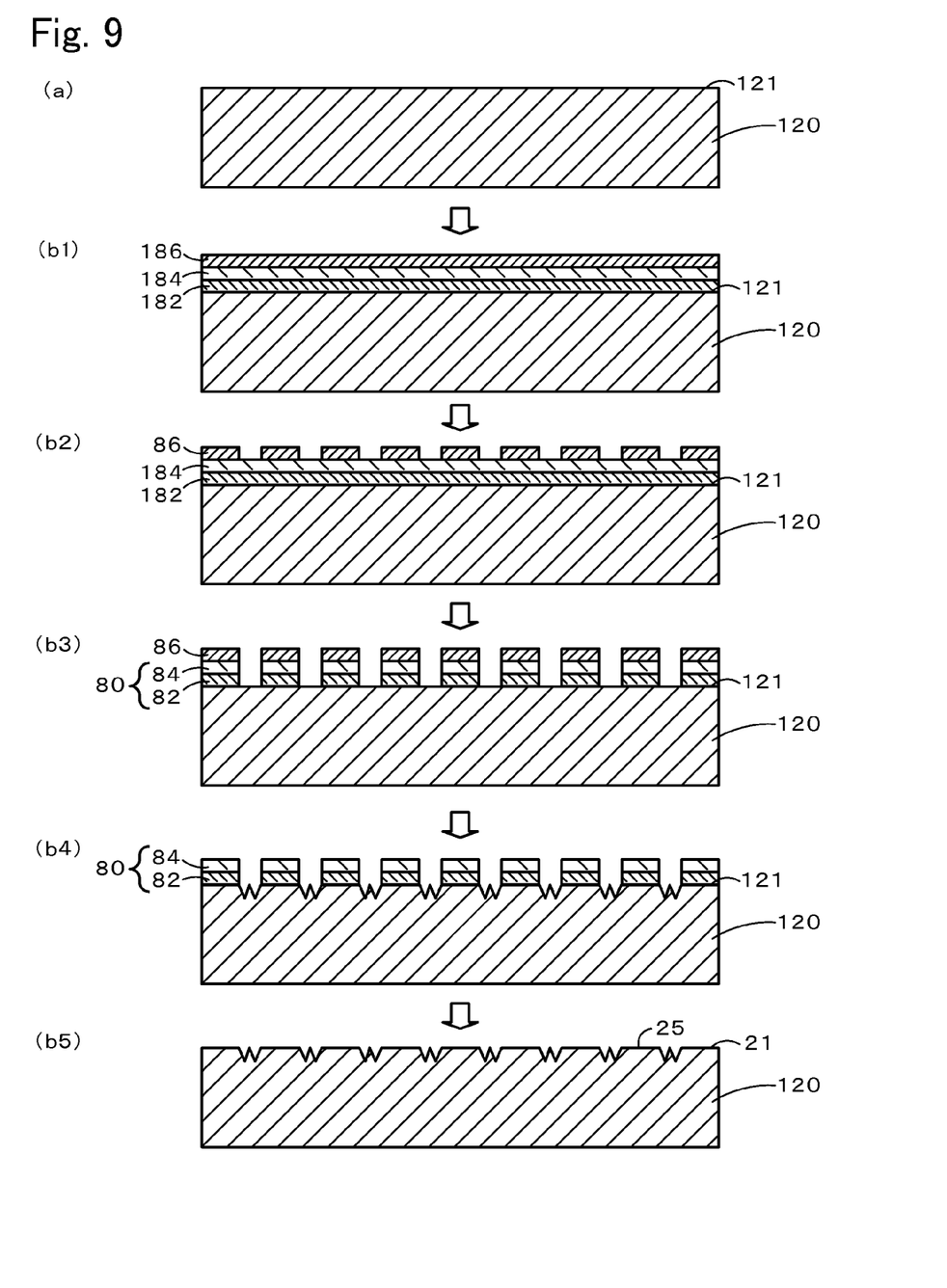
FIG. 9 includes explanatory views (cross-sectional views) schematically showing steps (a) and (b) in Example 2.

In Example 2, a composite substrate 10 shown in FIGS. 1 and 2 was produced by the same method as that in Example 1 except that, in the step (a), a piezoelectric substrate 120 having a mirror surface as a bonding surface 121 was prepared, and in the step (b), by roughening the bonding surface 121 such that at least some portions of the mirror surface remain as flat portions 25, an irregular surface which is partially planarized was formed. Using the composite substrate 10, a 1-port SAW resonator 40 shown in FIG. 4 was produced. FIG. 9 includes explanatory views (cross-sectional views) schematically showing the steps (a) and (b) in Example 2.

Specifically, production was performed as follows. First, in the step (a), a LiTaO₃ substrate having an OF, with a diameter of 4 inch and a thickness of 230 μm was prepared as a piezoelectric substrate 120 (FIG. 9(a)). A bonding surface 121 of the piezoelectric substrate 120 was subjected to mirror polishing. Specifically, the bonding surface 121 was subjected to lapping using diamond abrasive grains with an average grain size of 0.5 μm. Finally, the surface was subjected to CMP polishing using a non-woven pad such that the arithmetic average roughness Ra of the bonding surface 121 was 1 nm or less. Furthermore, a Si substrate having an OF, with a diameter of 4 inch and a thickness of 250 μm was prepared as a supporting substrate 30. The supporting substrate 30 had a bonding surface 31 which had been subjected to CMP polishing in advance such that the arithmetic average roughness Ra was 1 nm or less.

In the step (b), a metal film composed of chromium (first layer 182) serving as an underlayer and gold (second layer 184) disposed thereon was formed on the surface of the LT substrate, and a resist film 186 was further formed thereon (FIG. 9(b1)). Specifically, using a parallel plate RF sputtering system, film deposition was performed under the conditions of a degree of vacuum at the start of deposition of $1.5 \times 10^{-5}$ Pa, a gas (Ar) pressure of 0.5 Pa, a gas (Ar) flow rate of 20 sccm, and a substrate heating temperature of 150° C. The wafer transport speed in the deposition chamber was set at 14,000 pps during chromium deposition and at 3,600 pps during gold deposition. The transportation frequency was set at 1 during chromium deposition and at 3 during gold deposition. Thereby, the thickness of the gold (second layer 184) was 150 nm, and the thickness of the chromium (first layer 182) was 3 nm. The reason for using chromium as the underlayer for gold is to increase adhesion between gold and the wafer. Then, a resist was applied onto the surface of the gold layer to form the resist film 186. Subsequently, the resist was subjected to patterning by a photolithographic process, thereby forming a plurality of resist films 86 (FIG. 9(b2)). The pattern of the resist films 86 was linear. The width of portions covered with the resist (portions for forming a mirror surface) was set at 4 μm, and the width of portions not covered with the resist (portions for forming a rough surface) was set at 1 μm. Next, gold at the portions not covered with the resist was completely removed using iodine-potassium iodide. Furthermore, chromium was completely removed using a mixed solution of di-ammonium cerium nitrate and perchloric acid. Thereby, the first layer 182 and the second layer 184 were formed into a plurality of first layers 82 and a plurality of second layers 84, respectively, and portions of the surface of the LT substrate (bonding surface 121) were exposed (FIG. 9(b3)). That is, some portions of the bonding surface 121 were covered with a mask 80 including the first layer 82 and the second layer 84 (and the resist film 86). Then, the piezoelectric substrate 120 was etched by immersion in hydrofluoric acid for 30 minutes. Thereby, the portions of the bonding surface 121 not covered with the mask 80 were roughened by etching to form irregularities (FIG. 9(b4)). The resist film 86 was removed by etching. Then, the gold/chromium (mask 80) remaining in the pattern was removed (FIG. 9(b5)). Thereby, the portions of the bonding surface 121 covered with the mask 80, in which the mirror polishing in the step (a) was maintained, were formed into flat portions 25, and the portions other than those were roughened by etching and formed into an irregular surface (rough surface). Thus, a bonding surface 21 which was an irregular surface which is partially planarized was formed. The surface roughness of the bonding surface 21 was measured with an AFM. As a result, the arithmetic average roughness Ra of the flat portions 25 was 0.2 nm for an area 10 μm square. The arithmetic average roughness Ra of the etched portions was 100 nm for an area 10 μm square. Furthermore, in the bonding surface 21, the area ratio of the flat portions 25 to the region other than the flat portions 25 was 8:2. That is, the percentage of the area of the flat portions 25 in the area of the irregular surface which is partially planarized was 80%.

Next, in the step (c), the piezoelectric substrate 120 and the supporting substrate 30 were each subjected to scrubbing, acid washing, and organic cleaning in that order to clean the bonding surfaces 21 and 31. Then, the piezoelectric substrate 120 and the supporting substrate 30 were transported into an ultrahigh vacuum chamber. The bonding surfaces 21 and 31 were irradiated with neutral argon beams for about 60 seconds. The two substrates were left to stand for about 5 minutes until the surface temperatures of the bonding surfaces 21 and 31 decreased. The two substrates were brought into contact with each other, and under a pressure of 2 t, the piezoelectric substrate 120 and the supporting substrate 30 were directly bonded to each other to form a bonded substrate 110. In the step (d), the bonded substrate 110 was taken out, and the surface of the piezoelectric substrate 120 was ground/polished until the thickness of the piezoelectric substrate 120 became 20 μm to obtain a piezoelectric substrate 20. Thereby, a composite substrate 10 was produced.

Subsequently, 200 pairs of IDT electrodes 42 and 44 and reflecting electrodes 46 were formed by patterning on the piezoelectric substrate 20 of the composite substrate 10, and individual 1-port SAW resonators 40 were cut out by dicing. Frequency characteristics were measured on the 1-port SAW resonator 40 of Example 2. When comparison was made in terms of the peak value of the amplitude of spurious signals, in Example 2, the peak value of the amplitude of spurious signals was suppressed to a value that was 2.5 dB or more smaller than that of Comparative Example 1.

Comparative Example 2

An attempt was made to produce a composite substrate in which the percentage of the area of the flat portions 25 in the area of the irregular surface which is partially planarized was 10% by adjusting the pattern width of the resist film 86 and the metal film (mask 80) in the method of Example 2. However, bonding strength was weak, and the piezoelectric substrate 120 was separated from the supporting substrate 30 during polishing. From comparison between Example 2 and Comparative Example 2, it is believed that in order to obtain sufficient bonding power between the piezoelectric substrate and the supporting substrate, the percentage of the area of the flat portions 25 in the area of the irregular surface which is partially planarized is set preferably at more than 10%, for example, preferably at 20% or more, and more preferably at 30% or more.

Example 3

A composite substrate of Example 3 in which the percentage of the area of the flat portions 25 in the area of the irregular surface which is partially planarized was 90% was produced by adjusting the pattern width of the resist film 86 and the metal film (mask 80) in the method of Example 2. Using the composite substrate of Example 3, 1-port SAW resonators were produced as in Examples 1 and 2, and frequency characteristics were measured. In the 1-port SAW resonator of Example 3, the peak value of the amplitude of spurious signals was suppressed to a value that was 0.1 dB smaller than that of Comparative Example 1. However, the effect of suppressing the peak value of the amplitude of spurious signals was very smaller than that of Example 1 or 2. From comparison between Examples 1 to 3, it is believed that, in order to sufficiently suppress bulk waves, the percentage of the area of the flat portions 25 in the area of the irregular surface which is partially planarized is set preferably at less than 90%, for example, preferably at 800 or less.

The present application claims priority from Japanese Patent Application No. 2012-181006 filed on Aug. 17, 2012, the entire contents of which are incorporated in the present specification by reference.

INDUSTRIAL APPLICABILITY

The present invention can be applied to surface acoustic wave devices, such as resonators, filters, and convolvers.

REFERENCE SIGNS LIST 10 composite substrate, 12 space, 20, 120 piezoelectric substrate, 21, 121 bonding surface, 23, 23a, 123 protrusion, 25 flat portion, 26, 26a recess, 30 supporting substrate, 31 bonding surface, 40 1-port SAW resonator, 42, 44 IDT electrode, 46 reflecting electrode, ceramic substrate, 52, 54 pad, 56, 58 gold ball, 60 resin, 62, 64 electrode, 70 printed circuit board, 72, 74 pad, 76, 78 solder, 80 mask, 82, 182 first layer, 84, 184 second layer, 86, 186 resist film, 110 bonded substrate

What is claimed is:

1. A composite substrate comprising:
    a piezoelectric substrate; and
    a supporting substrate directly bonded to the piezoelectric substrate,
    wherein at least one of a bonding surface of the piezoelectric substrate and a bonding surface of the supporting substrate is an irregular surface which is partially planarized, the irregular surface which is partially planarized includes a plurality of protrusions, each having a flat portion on the tip thereof, and the piezoelectric substrate and the supporting substrate are directly bonded to each other at the flat portions, and
    in the irregular surface which is partially planarized, an arithmetic average roughness Ra of the flat portions is 1 nm or less, and an arithmetic average roughness Ra of portions other than the flat portions is 10 nm or more.

2. The composite substrate according to claim 1, wherein the percentage of the area of the flat portions in the area of the irregular surface which is partially planarized is 30% to 80%.

3. A surface acoustic wave device comprising:
    the composite substrate according to claim 1; and
    an electrode which is disposed on the piezoelectric substrate and capable of exciting a surface acoustic wave.

* * * * *